United States Patent
Li

(10) Patent No.: US 11,981,118 B2
(45) Date of Patent: May 14, 2024

(54) HOT FOIL STAMPING MACHINE

(71) Applicant: B&R INDUSTRIAL AUTOMATION GMBH, Eggelsberg (AT)

(72) Inventor: Lei Li, Shanghai (CN)

(73) Assignee: B&R INDUSTRIAL AUTOMATION GMBH, Eggelsberg (AT)

( * ) Notice: Subject to any disclaimer, the term of this patent is extended or adjusted under 35 U.S.C. 154(b) by 0 days.

(21) Appl. No.: 17/502,333

(22) Filed: Oct. 15, 2021

(65) Prior Publication Data
US 2022/0118757 A1 Apr. 21, 2022

(30) Foreign Application Priority Data

Oct. 16, 2020 (EP) .................................... 20202298

(51) Int. Cl.
*B41F 19/00* (2006.01)
*B41F 16/00* (2006.01)
(Continued)

(52) U.S. Cl.
CPC ........ *B41F 19/068* (2013.01); *B41F 16/0046* (2013.01); *B44C 1/1729* (2013.01); *G01K 7/427* (2013.01); *H01L 21/67103* (2013.01)

(58) Field of Classification Search
CPC .. B41F 19/068; B41F 16/0046; B44C 1/1729; G01K 7/427; H01L 21/67103
See application file for complete search history.

(56) References Cited

U.S. PATENT DOCUMENTS

| 4,722,609 A | * | 2/1988 | Epstein | .................. | G01K 17/20 |
| | | | | | 374/185 |
| 4,812,050 A | * | 3/1989 | Epstein | .................. | G01K 17/20 |
| | | | | | 250/252.1 |

(Continued)

FOREIGN PATENT DOCUMENTS

| CN | 101218517 B | * | 5/2012 | ............. | G01V 1/306 |
| CN | 112861329 B | * | 10/2022 | | |

(Continued)

OTHER PUBLICATIONS

Eigenfunction Expansion: "Math 108 Eigenfunction Expansion", Nov. 4, 2006https://services.math.duke.edu/~johnt/math108/eigenfunction_expansions.pdf (Year: 2006).*

(Continued)

*Primary Examiner* — Gail Kaplan Verbitsky
(74) *Attorney, Agent, or Firm* — GREENBLUM & BERNSTEIN, P.L.C.

(57) ABSTRACT

Hot foil stamping machine stamping a foil onto a substrate, which improves stamping quality under changing conditions, includes a control unit for controlling the temperature of the stamping interface surface to a predefined desired temperature. The control unit receives at least an actual temperature of the heating plate from the at least one temperature sensor and provides a manipulated variable to the at least one heating device. Further, the stamping machine includes a state observer for estimating an actual temperature of the stamping interface surface of the at least one stamping plate based on a physics-based analytical model of the heat transfer between the heating plate and the stamping plate. The control unit also includes a feedback controller for calculating the manipulated variable for a heating device based on the predefined desired temperature (Continued)

and the estimated actual temperature of the stamping interface surface provided by the state observer.

10 Claims, 4 Drawing Sheets

(51) Int. Cl.
    *B41F 19/06*       (2006.01)
    *B44C 1/17*        (2006.01)
    *G01K 7/42*        (2006.01)
    *H01L 21/67*      (2006.01)

(56) References Cited

U.S. PATENT DOCUMENTS

| | | | | |
|---|---|---|---|---|
| 7,048,434 | B2* | 5/2006 | Tregub | G01N 25/4846 |
| | | | | 374/45 |
| 8,096,705 | B2* | 1/2012 | Sri-Jayantha | G06F 1/206 |
| | | | | 374/111 |
| 8,220,989 | B1* | 7/2012 | Miller | G01N 25/18 |
| | | | | 374/43 |
| 8,541,720 | B2* | 9/2013 | Schwerer | H05B 1/0252 |
| | | | | 219/505 |
| 9,347,898 | B1* | 5/2016 | Smith | G01N 25/18 |
| 10,768,127 | B2* | 9/2020 | Sanda | G01N 25/18 |
| 2002/0041619 | A1* | 4/2002 | Merzliakov | G01N 25/4866 |
| | | | | 374/44 |
| 2002/0197591 | A1* | 12/2002 | Ebersole | G09B 19/00 |
| | | | | 434/226 |
| 2006/0013281 | A1 | 1/2006 | Sri-Jayantha et al. | |
| 2007/0127543 | A1* | 6/2007 | Petrovic | G01N 25/18 |
| | | | | 374/44 |
| 2015/0179529 | A1* | 6/2015 | Chen | G06F 30/20 |
| | | | | 374/10 |
| 2017/0028704 | A1* | 2/2017 | Brohard | B41D 1/06 |
| 2020/0401326 | A1* | 12/2020 | Fujimoto | G06F 1/3225 |

FOREIGN PATENT DOCUMENTS

| | | | |
|---|---|---|---|
| GB | 2513858 | | 11/2014 |
| JP | 2005315298 A | * | 5/2011 |
| JP | 2013228269 A | * | 11/2013 |
| JP | 2015152397 A | * | 8/2015 |
| KR | 20120102613 A | * | 1/2006 |
| WO | WO-2009094252 A1 | * | 7/2009 |
| WO | WO201720284 A1 | * | 7/2017 |
| WO | WO-2020234899 A2 | * | 11/2020 |

OTHER PUBLICATIONS

"Lumped-Element Impedance Standards," NIST, Dylan F. Williams, Dave K. Walker (Year: 1998).*

Europe Search Report conducted in counterpart Europe Appln. No. 20202298.4 (dated Apr. 19, 2021).

* cited by examiner

HOT FOIL STAMPING MACHINE

CROSS-REFERENCE TO RELATED APPLICATION

This application claims priority under 35 U.S.C § 119(a) to Europe Application No. EP 20202298.4 filed Oct. 16, 2020, the disclosure of which is expressly incorporated by reference herein in its entirety.

BACKGROUND

1. Field of the Invention

The invention relates to a hot foil stamping machine for stamping a metal foil onto a substrate, the stamping machine comprising a heating plate having a first surface and an opposite second surface, at least one heating device for heating at least a region of the heating plate, at least one temperature sensor for measuring a temperature of the heating plate, at least in a region of the heating plate and at least one stamping plate having a fifth surface and an opposite stamping interface surface, wherein the fifth surface of the stamping plate is attached to the second surface of the heating plate, wherein the stamping plate interface surface is configured for arranging the substrate onto which the metal foil is to be stamped by means of a stamping element of the stamping machine. The invention further relates to a method for determining a non-measurable temperature of a second surface of a component.

2. Discussion of Background Information

Hot foil stamping machines are commonly used to print a foil, preferably made of metal, onto a substrate at a relatively high temperature and proper pressure. A hot foil stamping machine essentially consists of a heating plate, an installation plate attached thereto and one or more hot stamping plates, which can be installed onto the installation plate. The number, sizes, and installation positions of the one or more hot stamping plates can be adjusted in order to perform different specific foil stamping operations. On each stamping plate, a stamping interface surface is provided for arranging the substrate, onto which the metal foil is to be stamped by a stamping head. During operation of the hot foil stamping machine, the heating plate is heated by means of a heating device, e.g. a resistance heater. Thus, the temperature of each stamping interface surface is raised to a certain operating temperature by heat conduction from the heating plate via the installation plate and the stamping plate.

A set of blowing nozzles can additionally be fixed at the outer edge of the installation plate in order to avoid adhesion of the substrate on the stamping interface at the end of each stamping process. In order to obtain satisfactory stamping quality, it is essential that the stamping interface temperature is maintained at a preferably constant value regardless of the ambient temperature, the blowing intensity of the blowing nozzles, the operating speed and area of the hot stamping. Otherwise poor stamping quality can result, due to undesired deteriorations in the finished metal foil on the substrate. However, due to the nature of the stamping process with the substrate and the stamping unit covering the stamping interface surface during the stamping process, direct temperature measurement of the stamping interface surface is not available, which makes it difficult to implement a closed-loop control system for controlling the interface temperature to the desired temperature.

To overcome this shortcoming, it is known to heat the heating plate to a preset elevated temperature for a given desired temperature of the stamping interface surface, where the elevated temperature values are obtained from a look-up table, in which steady-state temperature differences between the heating plate and the stamping interface surface are stored for different conditions (e.g. various stamping interface surface temperatures, various areas, various processing speed, various ambient temperatures, etc.).

However, the conventional look-up table method has a number of limitations, e.g. that no dynamic temperature differences are available, which are required to achieve proper temperature control performance. Therefore, inefficient heating and large errors in the temperature determination may result during the transient heating before steady-state conditions. Further, to obtain even temperature distribution under which the look-up tables were obtained, all of the available heating zones of the heating plate are fully excited, independent of the number of stamping plates, installed on the installation plate. Consequently, a large part of input energy will be wasted, especially when multiple stamping plates are clustered in the region of one or two heating zones. Furthermore, the ambient temperature, the operating speed, the number of stamping plates installed and also forced convection induced by the air-flow from the blowing nozzles may change in relatively wide ranges. To ensure as much accuracy as possible with the loop-up table method, huge efforts and thus a large amount of time are required to conduct multiple tests under different operating conditions for creating a proper data base.

SUMMARY

Embodiments provide a hot foil stamping machine, which allows for an improved stamping quality also under changing conditions. Other embodiments provide a method for the determination of a non-measurable temperature of a component's surface.

In embodiments, a hot foil stamping machine comprises a control unit for controlling the temperature of the stamping interface surface to a predefined desired temperature. The control unit is configured to receive at least an actual temperature of the heating plate from the at least one temperature sensor of the heating plate and to provide a manipulated variable to the at least one heating device. The stamping machine further includes a state observer for estimating an actual temperature of the stamping interface surface of the at least one stamping plate based on at least one physics-based analytical model of the heat transfer between the heating plate and the stamping plate. The control unit further includes a feedback controller for calculating the manipulated variable for the at least one heating device based on the predefined desired temperature and the estimated actual temperature of the stamping interface surface, provided by the state observer.

Preferably the stamping machine further includes an installation plate arranged between the heating plate and the stamping plate, the installation plate having a third surface attached to the second surface of the heating plate, and an opposite fourth surface onto which the fifth surface of the stamping plate is attached. Thus, e.g., an installation plate in the form of a honeycomb plate or the like can be used, which facilitates the installation of the one or more stamping plates, e.g. using suitable mounting brackets.

In an advantageous embodiment, the control unit further includes a feedforward controller for calculating a feedforward control value from the predefined desired temperature of the stamping interface surface based on the at least one physics-based analytical model. In this way the feedback controller only needs to adjust smaller errors, which improves the control performance.

It can be further beneficial, if the state observer comprises an observer compensator, preferably in the form of a PID-controller, for correcting the estimated actual temperature of the stamping interface surface of the at least one stamping plate based on available temperature measurements, wherein the available temperature measurements at least include the actual temperature of the heating plate, measured with the at least one temperature sensor and/or an ambient temperature.

Preferably the physics-based analytical model is a hybrid model comprising a distributed-parameter model and a lumped-parameter model, wherein in a preferred embodiment the distributed-parameter model is an eigen-function expansion model and the lumped-parameter model is a thermal impedance circuit model. By this, a real-time capable and therefore computationally-efficient model for the relation between the local control inputs of the heating device(s) of the heating plate and the stamping interface surface temperature subject to various heat-flux disturbances is provided, which enables an online temperature estimation and hence a good temperature control performance of the stamping interface surface.

It is advantageous that in the hybrid model the at least one heating plate, the preferably provided at least one installation plate and the at least one stamping plate are each divided into multiple layers along a principal axis, preferably perpendicular to one of the first, second, third, fourth, fifth surface or interface surface. The distributed-parameter model calculates a temperature distribution in each of the multiple layers and the lumped-parameter model calculates a heat flux between the multiple layers in the direction of the principal axis. Hence, planar heat diffusion and heat conduction along the principle axis, which are the dominant influence factors of the transient temperature of stamping interface surface can at first be formulated separately and can then be combined to form the hybrid model.

It is further preferred, that the hybrid model is a closed-loop model comprising a forward path and a feedback path, wherein the distributed-parameter model is implemented in the forward path and the lumped-parameter model is implemented in the feedback path. Thus, a model is provided which is physically intuitive and which represents the inherent structure of the heat transfer.

In embodiments, a method includes measuring an actual temperature of a first surface of the component, spaced from the second surface, preferably opposite the second surface, and estimating an actual temperature of the second surface based on the measured actual temperature of the first surface using at least one physics-based analytical model of the heat transfer between the first surface and the second surface. A hybrid model includes a distributed-parameter model and a lumped-parameter model is used as the physics-based analytical model.

Preferably the method further includes: controlling the temperature of the second surface of the component to a predefined desired temperature by calculating with a feedback controller a manipulated variable for a heating device based on the estimated actual temperature of the second surface and the predefined desired temperature of the second surface and heating the first surface of the component with the heating device using the calculated manipulated variable. By this, the estimated actual temperature can advantageously be used as an actual value in a feedback control.

The method according to the invention can advantageously be used for determining and/or controlling a non-measurable temperature of a surface of a component, preferably a stamping interface surface of a stamping plate of a hot foil stamping machine, a heating surface of a heating unit of a heat sealing machine, a surface of a wafer in semiconductor production or a heat-critical surface of an electronic component of an electronic device.

Other exemplary embodiments and advantages of the present invention may be ascertained by reviewing the present disclosure and the accompanying drawing.

BRIEF DESCRIPTION OF THE DRAWINGS

The present invention is explained in further detail below with reference to FIGS. 1 to 4, which show exemplary, schematic and non-limiting advantageous embodiments of the invention.

DETAILED DESCRIPTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
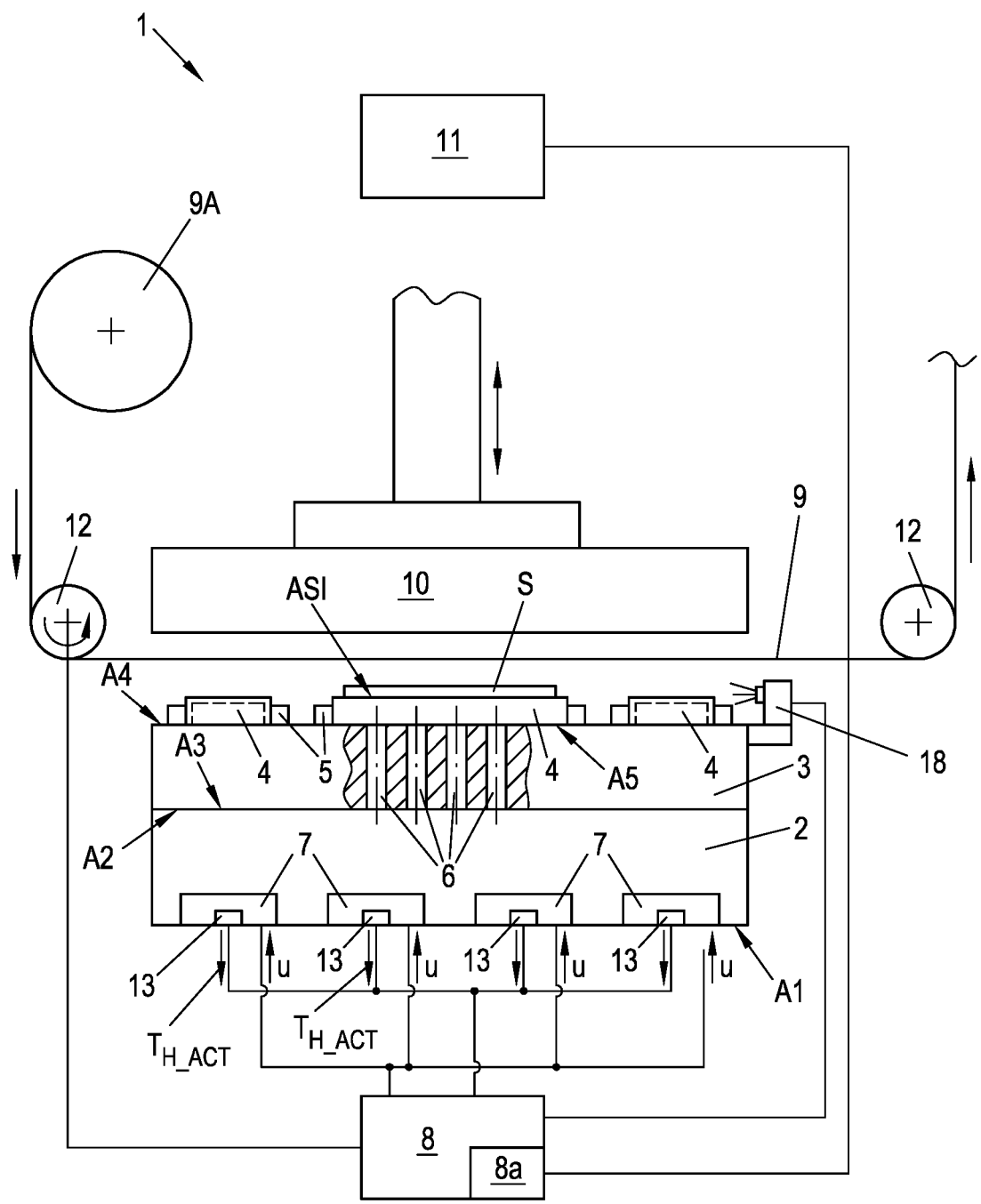
FIG. 1 shows the basic components of a hot foil stamping machine.

FIG. 1 shows a schematic example of a hot foil stamping machine 1. Since the structure and operation of a hot foil stamping machine is well known in the art, only those components are shown, which are relevant for the invention. The hot foil stamping machine 1 comprises a heating plate 2, which can, for example, be arranged on a base structure, which is not shown for the sake of simplicity. The heating plate 2 can, for example, be made of a rigid material like a metal or the like with suitable heat conductivity, e.g. a steel alloy. The heating plate 2 can be of a square, rectangular or any other shape and can comprise a first surface A1 and an opposite second surface A2. Preferably, the heating plate 2 has a uniform thickness between the opposite surfaces A1, A2. The heating plate 2 comprises at least one heating device 7, for example, in the form of one or more resistance heaters, which can be arranged in a grid pattern on the first surface A1 of the heating plate 2. By means of the heating device(s) 7, the heating plate 2 can be heated to a certain temperature. Further, one or more temperature sensors 13 are arranged on the heating plate 2 for measuring the temperature of the heating plate 2. E.g. one temperature sensor 13 can be provided in the region of each heating device 7 for measuring the temperature of the first surface A1 of the heating plate 2, as shown in FIG. 1.

On top of the second surface A2 of the heating plate 2, an optional installation plate 3 can be arranged, which can again be made of a suitable rigid material like steel alloy, with suitable heat conductivity. Again, the installation plate 3 can have a square, rectangular, round or any other shape. The installation plate 3 comprises a third surface A3 and an opposite fourth surface A4, wherein the third surface A3 is in contact with the second surface A2 of the heating plate 2. The fourth surface A4 of the installation plate 3 and the first surface A1 of the heating plate 2 are opposite to each other. The installation plate 3 has in turn a preferably uniform thickness between the third and fourth surfaces A3, A4 and can be fixed on the heating plate 2 essentially by means of any suitable mounting means, like screws or brackets (not shown). The installation plate 3 is configured for the installation of at least one stamping plate 4, but of course also multiple stamping plates 4 can be installed on the installation plate 3 at the same time, as shown in FIG. 1 in dashed lines. However, the installation plate 3 is only optional and the at least one stamping plate 4 could also be directly attached to the heating plate 2. In this case, suitable fastening elements for the installation of the stamping plate 4 are provided on the heating plate 2. Hence, the heating plate 2 serves as both heating plate for heating and installation plate for installation of the one or multiple stamping plates 4. In the following, the invention will be described with reference to one stamping plate 4 only.

The at least one stamping plate 4 can again be made of a rigid material with suitable heat conductivity like steel alloy. Again, the stamping plate 4 can have a square, rectangular, round or any other shape. The stamping plate 4 comprises a fifth surface A5 and an opposite stamping interface surface ASI. Assuming that a separate installation plate 3 is arranged between the heating plate 2 and the stamping plate 4 according to the example shown in FIG. 1, the fifth surface A5 is in contact with the fourth surface A4 of the installation plate 3. However, in case where no separate installation plate 3 is provided in the stamping machine 1, the fifth surface A5 of the stamping plate 4 is attached to the second surface A2 of the heating plate 2. The stamping plate 4 has in turn a preferably uniform thickness between the fifth surface A5 and the stamping interface surface ASI. The stamping plate 4 can be fixed on the installation plate 3 e.g. by means of suitable mounting brackets 5, as indicated in FIG. 1. In order to enable a quick and simple installation of one or more stamping plates 4 also at different positions on the installation plate 3, the installation plate 3 can, for example, have a honeycomb construction with multiple recesses. The exemplary installation plate 3 shown in FIG. 1 comprises multiple holes 6, which connect the opposite surfaces A3, A4 and which are preferably evenly spread over the installation plate 3 in order to achieve a honeycomb-like construction.

On top of the stamping plate 4, a substrate S can be arranged, onto which a foil 9 is to be stamped by performing a stamping process by means of the stamping machine 1. A large variety of material-combinations can be used for the substrate S and the foil 9. Materials such as paper, cardboard, plastics, leather, wood, etc. can be used for the substrate S. Essentially all metals and plastics, which are suitable for joining with the material of the used substrate S, can be used as material for the foil 9. However, metal foils are mostly used, e.g. gold, silver, bronze, copper or different metal alloys. The substrate S could, for example, be loosely arranged on the stamping interface surface ASI of the stamping plate 4 or could be fixed by means of any suitable fixing elements(s), which however need(s) to have a slightly smaller thickness than the substrate S.

The foil 9 can, for example, be provided in the form of one or more coils 9A onto which the foil 9 is wound up. From the coil 9A, the foil 9 can be supplied to the substrate S in a processing region of the stamping machine, e.g. over one or more fixed or adjustable rollers 12. In a simple embodiment the foil 9 can by supplied manually, e.g. by manually unwinding and moving the foil 9. However, to achieve higher productivity it can be advantageous to automatically feed the foil 9 to the processing region, e.g. by a suitable drive. For example, the coil 9A and/or the rollers 12 can be driven by means of an electric motor (not shown).

The hot foil stamping machine 1 can further comprise at least one stamping head 10, which is usually movably arranged above the stamping plate 4, as indicated with the double arrow in FIG. 1. The stamping head 10 can be made of a suitable material, e.g. a metal similar to the stamping plate 4, the installation plate 3 or the heating plate 2. For performing a stamping process, the stamping head 10 can be moved towards the substrate S in order to press the foil 9 onto the substrate S, whereby a certain stamping force is applied onto the foil 9 and the substrate S. During the stamping process, the substrate S is heated to a certain desired stamping temperature by means of the heat generated by the heating plate 2 and conducted from the heating plate 2 via the installation plate 3 to the stamping plate 4. Under the action of the pressing force and the heat provided by the heating plate 2, the foil 9 is plated onto the substrate S.

After a certain processing time, the stamping head 10 is retracted and the finished substrate S including the attached foil 9 can be removed. The required processing temperature of the substrate S of course depends on the material of the foil 9 and the material of the substrate S itself and is usually in the range between 100° C. and 300° C. For given conditions (material and shape of the substrate S as well as the material of the foil 9), the required temperature of the stamping interface surface ASI is assumed to be known and is in the following designated as desired temperature $T_{SI\_D}$ of the interface surface ASI of the stamping plate 4. In order to facilitate the removal of the finished substrate S with the foil 9 stamped thereon from the stamping plate 4, blowing nozzles 18 can optionally be provided in the stamping machine 1, for example, on the outer edge of the installation plate 3. By means of the blowing nozzles 18 pressurized air can be supplied to the substrate S, e.g. preferably between the substrate S and the stamping interface surface ASI.

In order to achieve specific patterns of the foil 9 stamped on the substrate S, like logos, texts, etc., the surface of the stamping head 10 (facing the substrate S) can also be shaped in a respective fashion. In order to change the pattern flexibly, interchangeable inserts with different patterns could be provided. In a simple implementation, the stamping head 10 can, for example, be manually operable, e.g. by means of a lever (not shown). However, to achieve higher productivity and better stamping quality it can be advantageous that the stamping head is operated automatically by a suitable drive 11, e.g. (electro)-mechanically or (electro)-hydraulically. Thus, a consistent processing speed (which essentially corresponds to the duration of the pressing action) and a consistent stamping force can be reached, which lead to constant stamping quality.

For controlling the hot foil stamping machine 1, at least one control unit 8 is provided in the hot foil stamping machine 1, e.g. in the form of a suitable microprocessor-based hardware and/or software. The control unit 8 can, for example, also comprise a Programmable Logic Controller (PLC), a Field Programmable Gate Array (FPGA), an application-specific integrated circuit (ASIC), an analogue computer, or an analogue circuit. With the control unit 8, at least the heating plate 2, in particular the one or more heating devices 7, can be controlled. If the stamping head 10 is automatically driven, e.g. by a drive 11 and/or the foil 9 is automatically supplied, e.g. by a drive of a roller 12, the control unit 8 can also be used for controlling the drive 11 and/or the drive of a roller 12, as is indicated by the connection lines in FIG. 1. The control unit 8 can, for example, control the feeding speed of the foil 9, and/or the stamping speed, and/or the stamping force of the stamping head 10. When blowing nozzles 18 are provided in the stamping machine 1, the control unit 8 can also control the blowing nozzles 18, e.g. the amount of air supplied by the blowing nozzles 18, e.g. in form of a volume flow or pressure. For adjusting different parameters of the stamping process (e.g. processing speed, desired temperature of the stamping interface surface ASI, stamping pressure, etc.), a user interface 8a can be provided in the stamping machine 1, for example, in the control unit 8.

As described at the outset, since no direct temperature measurement of the temperature of the stamping interface surface ASI of the stamping plate 4 is possible, the control input was hitherto based on a look-up-table, in which a steady state dependency between the temperature of the heating plate 2, especially of the first surface A1 of the heating plate 2, and the stamping interface surface ASI of the stamping plate 4 is stored. However, due to changing processing conditions (number of stamping plates installed, ambient temperature, processing speed, temperature and volume flow of the air supplied by blowing nozzles 18, etc.) with the look-up-table method, high quality standards cannot be sufficiently met. Therefore, according to the invention an improved stamping machine 1 with better performance is provided, as will be described in the following with reference to FIG. 2+FIG. 3.

According to the invention, the stamping machine 1 comprises a control unit 8 for controlling the temperature $T_{SI}$ of the stamping interface surface ASI to a predefined desired temperature $T_{SI\_D}$, wherein the control unit 8 is configured to receive at least an actual temperature $T_{H\_ACT}$ of the heating plate 2 from the at least one temperature sensor 13 of the heating plate 2 and to provide a manipulated variable u to the at least one heating device 7. The stamping machine 1 further comprises a state observer 14 for estimating an actual temperature $\hat{T}_{SI\_ACT}$ of the stamping interface surface ASI of the at least one stamping plate 4 based on at least one physics-based analytical model 17 of the heat transfer between the heating plate 2 and the stamping plate 4.

Figure 2:
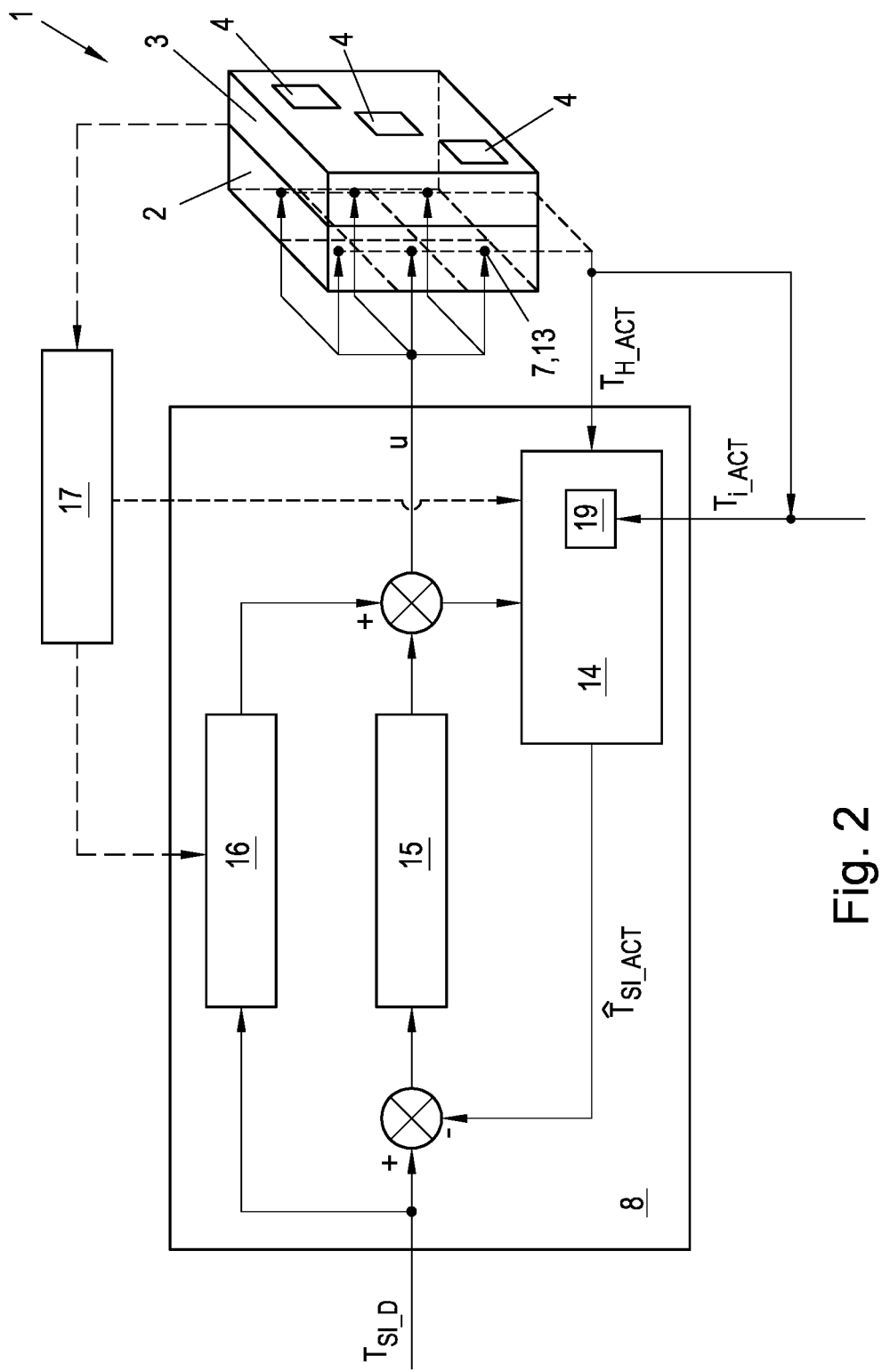
FIG. 2 shows a control scheme for temperature control.

The state observer 14 can, for example, be provided in form of a separate component (e.g. a piece of hardware or software) or can be implemented in the control unit 8 (e.g. as software), as shown in FIG. 2. The control unit 8 further comprises a feedback controller 15 for calculating the manipulated variable u for the at least one heating device 7 based on the predefined desired temperature $T_{SI\_D}$ and the estimated actual temperature $\hat{T}_{SI\_ACT}$ of the stamping interface surface ASI, provided by the state observer 14, usually based on an error between the desired temperature $T_{SI\_D}$ and the estimated actual temperature $\hat{T}_{SI\_ACT}$. The feedback controller 15 can, for instance, comprise a suitable controller, known in the art, e.g. a PID-controller or PI-controller. For the sake of clarity, the stamping machine 1 is shown in a simplified manner in FIG. 2 and the heating devices 7 and the temperature sensors 13 are shown as nodes of a grid, in which they are arranged on the first surface A1 of the heating plate 2. Of course, a heating device 7 does not necessarily need to heat the heating plate 2 exactly on a node as shown, but can rather heat the heating plate 2 on a certain area.

Preferably the control unit 8 further comprises a feedforward controller 16 for calculating a feedforward control value from the predefined desired temperature $T_{SI\_D}$ of the stamping interface surface ASI based on the at least one physics-based analytical model 17. In particular, the feedforward control values are calculated for a desired temperature distribution on the stamping interface surface ASI, taking into account the stamping plate area(s) and installation position(s) of the number of stamping plates 4, installed in the stamping machine 1. The feedforward control values are calculated from an inverse solution of the physics-based analytical model 17. For example, in order to reduce heating-energy, the desired temperature distribution can comprise a specific desired temperature $T_{SI\_D}$ for the area(s) of stamping interface surface(s) ASI of the one or more stamping plates 4 and can further comprise a desired temperature of the region(s) outside of the area(s) of stamping interface surface(s) ASI of the one or more stamping plates 4.

Although the feedback controller 15, the state observer 14 and the feedforward controller 16 are indicated as separate components in the control structure shown in FIG. 2, it is apparent for a person skilled in the art, that they could of course also be implemented in form of software in the control unit 8. Further it is to be understood that the physics-based analytical model 17 is not a physical component of the control circuit of FIG. 2 (indicated with the dashed lines), but rather represents a mathematical description of the thermal behavior of the stamping machine 1 which serves as a basis for the design of the state observer 14 and the optional feedforward controller 16. The physics-based analytical model 17 can, for example, be implemented in both, the state observer 14 and the optional feedforward controller 16 in a suitable form. Therefore, the block shown in FIG. 2, which represents the physics-based analytical model 17, is merely shown for the sake of clarity.

Due to the physics-based analytical model 17 of the stamping machine 1, it is now possible to implement a feedback control of the stamping interface temperature $T_{SI}$, because it is possible to relatively precisely estimate the actual temperature $\hat{T}_{SI\_ACT}$ of the stamping interface surface ASI of the stamping plate 4, although no direct measurement is available.

In order to correct the estimated actual temperature $\hat{T}_{SI\_ACT}$ of the stamping interface surface ASI of the stamping plate 4, an observer compensator 19 can optionally be provided in the stamping machine 1, in particular implemented in the state observer 14, preferably in the form of a PID-controller, or any other suitable controller. The correction is based on available temperature measurements $T_{i\_ACT}$, preferably the actual temperature $T_{H\_ACT}$ of the heating plate 2, measured with the at least one temperature sensor 13.

Preferably, the physics-based analytical model 17 is a hybrid model comprising a distributed-parameter model DPM and a lumped-parameter model LPM, as will be further described with reference to FIG. 3. In the hybrid model the heating plate 2, the (optional) installation plate 3 and the stamping plate 4 are each divided into multiple layers LAi along a principal axis. The principal axis is preferably perpendicular to at least one of the first, second, third, fourth, fifth surface A1-A5 or interface surface ASI, e.g. a vertical axis in FIG. 1. With the aid of the distributed-parameter model DPM, a temperature distribution in each of the multiple layers LAi can be calculated based on a heat flux input HFI into an input layer $LA_{IP}$. With the aid of the lumped-parameter model LPM, a heat flux between the multiple layers LAi along the principal axis can be calculated. According to the example shown in FIG. 3, the stamping machine 1 is divided into an input layer $LA_{IP}$, two middle layers $LA_M$, and an output layer $LA_{OP}$, but it is of course possible to choose another subdivision with more or less layers, however, at least two layers are required (input layer $LA_{IP}$ and output layer $LA_{OP}$). The input layer $LA_{IP}$ corresponds to the first surface A1 of the heating plate 2 on which the heating devices 7 are arranged, which provide the heat flux input HFI. The output layer $LA_{OP}$ corresponds to the stamping interface surface ASI of the stamping plate 4 where the actual temperature $\hat{T}_{SI\_ACT}$ is to be estimated. Due to the segmental heating zones of the heating device(s) 7, the heat-flux inputs HFI are locally exerted on the input layer $LA_{IP}$ and due to the finite operating area(s) of the stamping plate(s) 4, the disturbances are non-uniformly distributed on the output layer $LA_{OP}$. To account for the effects of local boundary conditions and thermal couplings among the heating zones on the resulting highly non-uniform temperature distribution, a very large number of model elements (such as resistances R, capacitances C etc.—see below) would be required, if only a lumped-parameter model would be used as single model for the mathematical description for the heat transfer of the stamping machine 1. This would however lead to large computation time, which is undesired in terms of a preferred real-time temperature estimation/control. On the other hand, it would also be very difficult to analytically solve the transient three-dimensional temperature field using only a distributed-parameter model, while numerical calculation techniques (such as, the finite element method) would also require huge computation efforts. Therefore, in order to achieve sufficiently low computation efforts, fast calculation time respectively and at the same time sufficient calculation accuracy, a combination of a lumped-parameter model and a distributed-parameter model in the form of a hybrid-model is used in the present invention.

In a preferred embodiment, the distributed-parameter model DPM is an eigen-function expansion model and the lumped-parameter model LPM is a thermal impedance circuit model. With the thermal impedance circuit model, the dynamic relationships among layers are modeled, where each layer LAi is formulated as a circuit node (Kirchhoff's node law is satisfied) and the thermal dynamics between adjacent layers LAi are described as thermal resistances R and thermal capacitances C, as shown in FIG. 3. Local heat-flux disturbances on the output layer $LA_{OP}$ that corresponds to the stamping interface surface ASI of the stamping plate 4 are also modelled as local thermal resistance R. The hybrid model is preferably modeled as a closed-loop model comprising a forward path and a feedback path, wherein the forward path describes the layer temperature distribution in each layer LAi based on the given heat-flux input HFI to the input layer $LA_{IP}$, while the feedback path accounts for the conducted heat-flux (between the layers LAi) for a given temperature distribution. The distributed-parameter model DPM is implemented in the forward path and the lumped-parameter model LPM is implemented in the feedback path, as depicted in FIG. 3.

When the hybrid model is formulated, identification experiments can be conducted using an identification algorithm to determine heat-flux disturbance as a function of working conditions (e.g. processing speed, ambient temperature, use of blowing nozzles, etc.). Such identification algorithms are known in the art, for example, from the book: OZISIK, M. Necati et al., 2000. Inverse Heat Transfer: Fundamentals and Applications, ISBN 978-1560328384. With the hybrid model implemented in the control scheme according to FIG. 2, the heating plate 2 is heated (based on the calculated manipulated variables u provided to the heating devices 7) in such a way, that due to a temperature difference, a heat flux towards the stamping plate 4 is created, which counteracts to the varying heat flux disturbances at the stamping interface surface ASI (caused by stamping under different working conditions) and hence to maintain the stamping interface temperature $T_{SI}$ at a the desired temperature $T_{SI\_D}$.

Figure 4:
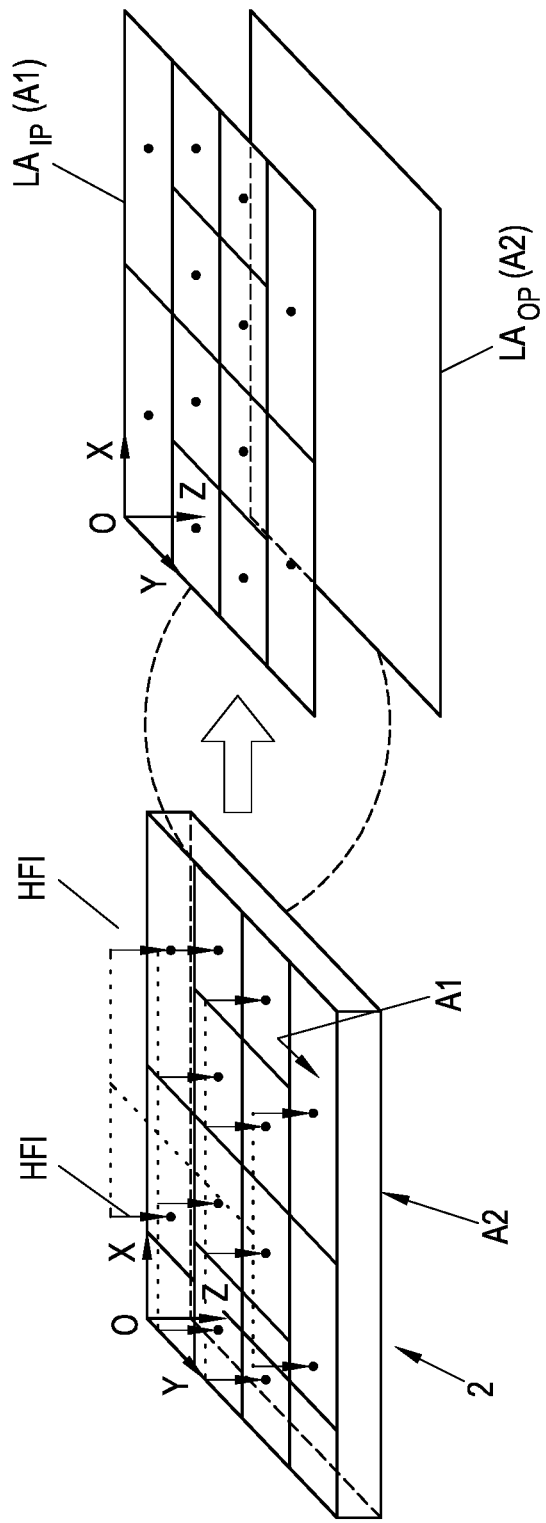
FIG. 4 shows a heating plate for the description of an analytical heat transfer model.

An exemplary physics-based analytical model 17 is presented in the following with reference to FIG. 4. For the sake of simplicity, the physics-based analytical model 17 is shown for the heating plate 2 only. On the left side the heating plate 2 is shown with a coordinate system, which is used for the mathematical description, having the origin O in the top left corner. The XY-plane spanned by the X-axis and Y-axis corresponds to the first surface A1 of the heating plate 2. The Z-axis as the principal axis is perpendicular to first surface A1 and extends in the direction towards the opposite second surface A2 of the heating plate 2. As described above, multiple heating devices 7 (not shown) are arranged on the heating plate 2 in a grid pattern, each heating device 7 indicated as a node in FIG. 4. Each heating device 7 as a heat source provides a heat flux input HFI into the respective node of the first surface A1 of the heating plate 2, indicated by the arrows in FIG. 4.

The heating plate 2 is subjected to a time-varying convection with a heat transfer coefficient $h_Z$ at its second (bottom) surface A2. When the heating plate 2 is exposed to the environment with an ambient temperature, the transient temperature distribution is not only determined by the XY-plane heat diffusion with given control inputs, but also influenced by the heat-flux flowing in the direction of the Z-axis towards the second surface A2. The heat-flux inputs HFI raise the temperature in the XY-plane to provide a temperature difference for a heat conduction in direction of the Z-axis, through which the heat-flux flows from the first surface A1 towards the second surface A2 to counteract time-varying convective boundary conditions in order to maintain the temperature of the second surface A2 at a certain level (=desired temperature, e.g. corresponding to the desired temperature $T_{SI\_D}$ of the stamping interface surface ASI in the complete stamping machine 1—see FIG. 1+2).

The mentioned effects of Z-axis heat conduction and XY-plane heat diffusion on the transient behaviors of the temperature distribution can be fully characterized by the hybrid model, preferably in form of a closed-loop model, as was described above with reference to FIG. 3. Again, the forward path describes the temperature distribution determined by XY-plane heat diffusion with known heat-flux inputs HFI, while negative feedback accounts for the dissipated heat-flux through Z-axis heat conduction for a given temperature distribution and convective boundary conditions. The XY-plane heat diffusion is preferably described as a distributed-parameter model DPM and the heat conduction in the direction of the Z-axis is preferably described as a lumped-parameter model LPM, in particular as an impedance-circuit (see FIG. 3). As previously described above with reference to FIG. 3, in the hybrid model the heating plate 2 is divided into multiple layers LAi, wherein only two layers LAi are used in the example shown in FIG. 4. The first layer is the input layer $LA_{IP}$ corresponding to the first surface A1 of the heating plate 2 and the second layer is the output layer $LA_{OP}$, corresponding to the second surface A2 of the heating plate 2, opposite the first surface A1, as is depicted on the right side of FIG. 4.

In the following example, the temperature distribution in the input layer $LA_{IP}$ (XY-plane, z=0) is first solved analytically utilizing an eigen-function expansion method. Thereafter the analytical model formulation of the heat conduction in the direction of the Z-axis is described as a thermal impedance-circuit (see FIG. 3) and finally the combination in form of the closed-loop model is shown.

The governing equation for the temperature-field $T_{he}(t, x, y, z)$ within the heating plate 2 can be derived by Equation (1a), wherein $T_{he}=T-T_A$ and $T_A$ is the ambient temperature.

$$\frac{\partial T_{he}(t, x, y, z)}{\partial t} - \alpha^2 \nabla^2 T_{he} = 0 \tag{1a}$$

Equations (1b) show the boundary conditions BC for the X, Y and Z-axis.

$$BCs: \begin{cases} \frac{dT_{he}(t, x, y, z)}{dx}\Big|_{x=0} = -\frac{h_n T_{he}(t, 0, y, z)}{\kappa}; \frac{dT_{he}(t, x, y, z)}{dx}\Big|_{x=X} = -\frac{h_n T_{he}(t, X, y, z)}{\kappa} \\ \frac{dT_{he}(t, x, y, z)}{dx}\Big|_{y=0} = -\frac{h_n T_{he}(t, x, 0, z)}{\kappa}; \frac{dT_{he}(t, x, y, z)}{dx}\Big|_{y=Y} = -\frac{h_n T_{he}(t, x, Y, z)}{\kappa} \\ \frac{dT_{he}(t, x, y, z)}{dz}\Big|_{z=0} = g(t, x, y, 0); \frac{dT_{he}(t, x, y, z)}{dz}\Big|_{z=Z} = -\frac{h_z T_{he}(t, x, y, Z)}{\kappa} \end{cases} \tag{1b}$$

The initial condition for the time t=0 is shown in Equations (1c, 1d).

$$T_{he}(0,x,y,z)=0 \text{ with } \alpha^2=\kappa/\rho c_p \tag{1c, 1d}$$

In Equations (1c, 1d), $\alpha$ is the thermal diffusion coefficient, $h_n$ and $h_z$ are the heat transfer coefficients in the XY-plane and Z-axis respectively, $\kappa$ is the heat conductivity, $\rho$ is the density and $c_p$ is the specific heat capacity of the heating plate 2. X, Y, Z are the Length, Width and Height of the heating plate 2 (see FIG. 4). The boundary input g(t, x, y, 0) in Equation (1b) is expressed as Equation (2a) wherein the element $u_i$ of control input vector u(t) is applied to the $i^{th}$ heating zone (e.g. 1=1, 2, . . . 12 for the twelve nodes shown in the example according to FIG. 4, corresponding to the heating devices 7), with its heating area $g_i(x, y)$ characterized by length $L_i$, width $W_i$ and install position on the XY-plane $l_i+L_i/2$, $w_i+W_i/2$:

$$g(t, x, y) = \sum_{i=1}^{12}[u_i(t)g_i(x, y)] = g(x, y)u(t) \tag{2a, 2b}$$

where $$u(t) = [\ldots\ u_i(t)\ \ldots]^T$$
$$g(x, y) = [\ldots\ g_i(x, y)\ \ldots] \tag{2c, 2d}$$

with $$g_i(x, y) = \begin{cases} 1 & w_i < x \leq w_i + W_i;\ l_i < y \leq l_i + L_i \\ 0 & \text{others} \end{cases}$$

To account for the effects of segmental boundary control inputs on the XY-plane temperature distribution and Z-axis heat conduction, the solutions to the governing Equations (1a-1c) are assumed to take the form of Equation (3a) where $T_{hei}$ is the transient temperature distribution of the input layer $LA_{IP}$ at z=0 contributed by the 1th heating zone and $T_{he}(t, z)$ characterizes the Z-axis heat conduction dynamics:

$$T_{he}(t, x, y, z) = f\left(\sum_{i=1}^{12} T_{hei}(t, x, y, 0), T_{he}(t, z)\right) \tag{3a}$$

$$\frac{\partial T_{hei}(t, x, y)}{\partial t} - \alpha^2\left(\frac{\partial^2 T_{hei}}{\partial x^2} + \frac{\partial^2 T_{hei}}{\partial y^2}\right) = u_i(t)g_i(x, y) \tag{3b}$$

$$BCs: \begin{cases} \frac{dT_{hei}(t, x, y)}{dx}\Big|_{x=0} = -\frac{h_n T_{hei}(t, 0, y)}{\kappa}; \frac{dT_{hei}(t, x, y)}{dx}\Big|_{x=X} = -\frac{h_n T_{hei}(t, X, y)}{\kappa} \\ \frac{dT_{hei}(t, x, y)}{dy}\Big|_{y=0} = -\frac{h_n T_{hei}(t, x, 0)}{\kappa}; \frac{dT_{hei}(t, x, y)}{dx}\Big|_{y=Y} = -\frac{h_n T_{hei}(t, x, Y)}{\kappa} \end{cases} \tag{3c}$$

With the initial condition $T_{hei}(0, x, y) = 0$ \hfill (3d)

Utilizing the eigen-function expansion model, the solutions to the layer temperature-field governing Equations (3b-3d) can be derived as a time-space separation form according to Equation (4a):

$$\theta(t, x, y) = \sum_{m,n=0}^{\infty} \theta_{mn}(t)\phi_{mn}(x, y) = \sum_{m,n=0}^{\infty} \theta_{mn}\phi_m(x)\phi_n(y) \quad (4a)$$

with $$\theta(t, x, y) = T_{hei}(t, x, y, 0)$$

with (4b)

$$\phi_m(x) = \begin{cases} \dfrac{\sin(m\pi x/X) - (\kappa m\pi/Xh_n)\cos(m\pi x/X)}{\sqrt{1 + (\kappa m\pi/Xh_n)^2}} & m \neq 0 \\ 1 & m = 0 \end{cases}$$

and (4c)

$$\phi_n(y) = \begin{cases} \dfrac{\sin(n\pi y/Y) - (\kappa m\pi/Yh_n)\cos(m\pi y/Y)}{\sqrt{1 + (\kappa n\pi/Yh_n)^2}} & n \neq 0 \\ 1 & n = 0 \end{cases}$$

In Equations (4a-4c), $\phi_{mn}(x, y)$ is the spatial harmonic kernel function of the layer temperature distribution with a time-dependent coefficient $T_{mn}^{hei}$. Similarly, the segmental control input can also be formulated as a series of spatial harmonic kernel functions according to Equations (5a-5e):

$$g_i(t, x, y) = \sum_{m,n=0}^{\infty} G_{mn}^i \phi_{mn}(x, y) \quad (5a)$$

where (5b, 5c)

$$G_{00}^i = \dfrac{L_i W_i}{XY};$$

$$G_{mn}^i = \dfrac{4}{XY} \int_{l_i}^{l_i+L_i} \int_{w_i}^{w_i+W_i} g_i(x, y)\phi_{mn}(x, y)dxdy$$

with $m, n \neq 0$ $$G_{m0}^i = \dfrac{2L_i}{XY} \int_{w_i}^{w_i+W_i} g_i(x, y)\phi_m(x)dx \quad (5d, 5e)$$

with $m \neq 0$;

$$G_{0n}^i = \dfrac{2W_i}{XY} \int_{l_i}^{l_i+L_i} g_i(x, y)\phi_n(y)dy$$

with $n \neq 0$

When Equations (4a) and (5a) are substituted into Equation (3b), $T_{hei}$ can be expressed by:

$$\dfrac{dT_{mn}^{hei}}{dt} + \dfrac{T_{mn}^{hei}(t)}{\tau_{mn}} = u_i(t)G_{mn}^i \quad (6a, 6b)$$

where $$\dfrac{1}{\tau_{mn}} = \alpha^2\left[(m\pi/X)^2 + (n\pi/Y)^2\right]$$

$$T_{hei}(t, x, y, 0) = \sum_{m,n=0}^{\infty}\left[\int_0^t u_i(\tau)\exp\left(-(t-\tau)\dfrac{1}{\tau_{mn}}\right)d\tau\right]G_{mn}^i\phi_{mn}(x, y) \quad (6c)$$

In Equation (6b), $\tau_{mn}$ is the heat-diffusion time constant of the $(m, n)^{th}$ spatial harmonics. It decreases with growing thermal diffusion coefficient $\alpha$, harmonic orders (m, n) and reduced contour dimensions (X, Y). When Equation (6c) is combined with Equation (3a), the temperature distribution contributed by all the heating zones is described according to Equations (7a, 7b) where $u_{mn}$ characterizes the transient spatial distribution of the boundary control inputs:

$$T_{he}(t, x, y, 0) = \quad (7a)$$

$$\sum_{m,n=}^{\infty} T_{mn}^{he}(t)\phi_{mn}(x, y) = \sum_{m,n=0}^{\infty}\left[\int_0^t u_{mn}(\tau)\exp\left(-(t-\tau)\dfrac{1}{\tau_{mn}}\right)d\tau\right]\phi_{mn}(x, y)$$

$$u_{mn}(t) = \sum_{i=1}^{12} u_i(t) G_{mn}^i \quad (7b)$$

$$\dfrac{T_{mn}^{he}(s)}{U_{mn}(s)} = \dfrac{1}{s + 1/\tau_{mn}} \quad (7c)$$

With the local heat-flux inputs HFI and the resulting temperature distribution in the input layer $LA_{IP}$ characterized by $u_{mn}(t)$ and $T_{mn}^{he}(t)$ respectively, the forward path transfer function (see FIG. 3) that describes the dynamics of XY-plane heat-diffusion can be derived from Equation (7a), as shown in Equation (7c), where s is the Laplace operator.

Figure 3:
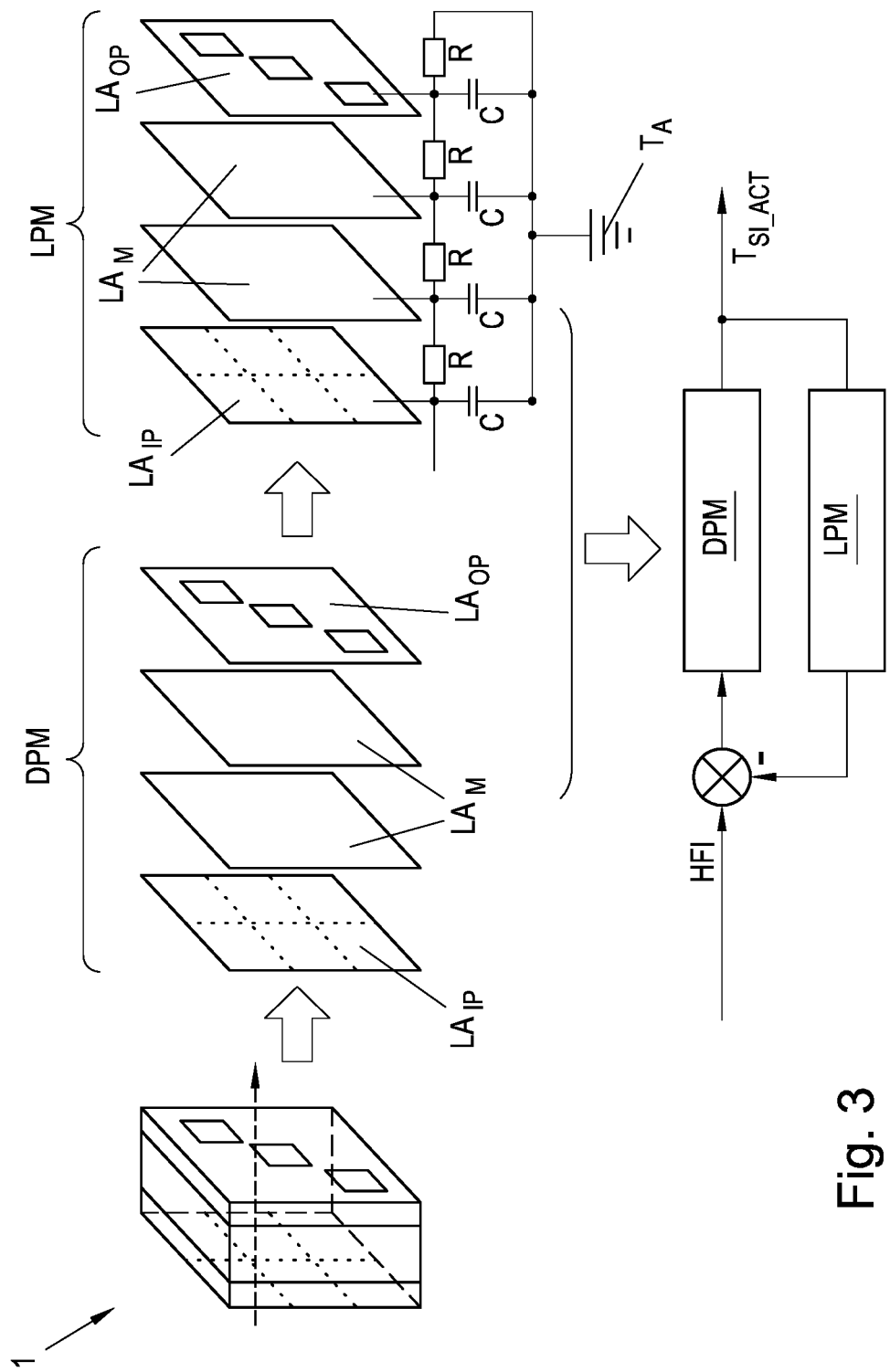
FIG. 3 shows a hybrid model used for temperature estimation.

Using the thermal impedance circuit shown in FIG. 3, the transfer function of the dissipated heat-flux $Q_{mn}^{he}$ with known temperature distribution $T_{mn}^{he}$ can be obtained from Equations (8a, 8b). The closed-loop transfer function that computes the temperature distribution $T_{mn}^{he}$ for the control input, $U_{mn}(s)$ can be defined according to Equations (8c, 8d).

$$\dfrac{Q_{mn}^{he}(s)}{T_{mn}^{he}(s)} = \dfrac{\tau_{he}s + 1}{\tau_{he}} \quad (8a, 8b)$$

where $\tau_{he} = C_{he}(R_{he} + 1/h_z)$ $$\dfrac{T_{mn}^{he}(s)}{U_{mn}(s)} = \dfrac{\tau_{he\_mn}/2}{\tau_{he\_mn}s + 1} \quad (8c, 8d)$$

where $$\tau_{he\_mn} = \dfrac{2\tau_{he}}{1 + \tau_{he}/\tau_{mn}}$$

In Equations (8a-8d), $C_{he}$ is the Z-axis heat capacitance and $R_{he}$ is the Z-axis heat resistance of the heating plate 2. $\tau_{he\_mn}$ is the synthesized time constant accounting for the XY-plane heat-diffusion time constant $\tau_{mn}$ as well as Z-axis heat conduction time constant $\tau_{he}$. For different time constant ratios $\tau_{he}/\tau_{mn}$, Equations (8c, 8d) provide the dynamic characteristics of temperature distribution $T_{mn}^{he}$ at the input layer $LA_{IP}$ at z=0. Essentially the following two cases can be considered. In case 1 ($\tau_{mn} \gg \tau_{he}$ or $\tau_{he\_mn} = 2\tau_{he}$) the dynamics of the Z-axis heat conduction is relatively fast compared to that of the heat diffusion in the XY-plane and the control input energy is therefore mainly transferred into the layer z=Z with the time constant $2\tau_{he}$. In case 2 ($\tau_{mn} \ll \tau_{he}$ or $\tau_{he\_mn} \approx 2\tau_{mn}$) the dynamics of the Z-axis heat conduction is relatively slow compared to that of the heat diffusion in the XY-plane and the control input energy is mainly used for XY-plane heat diffusion with the time constant $2\tau_{mn}$.

The transient (or time-domain) temperature distribution $\tau_{he}(t,x,y,0)$ at the input layer $LA_{IP}$ at z=0 can be derived according to Equation (9):

$$T_{he}(t, x, y, 0) = \frac{1}{2} \sum_{m,n=0}^{\infty} \left[ \int_0^t u_{mn}(\tau) \exp\left(-(t-\tau)\frac{1}{\tau_{he\_mn}}\right) d\tau \right] \phi_{mn}(x, y) \quad (9)$$

It can be seen that Equation (9) has the same form as Equations (7a, 7b), but with a different time constant and a smaller steady-state amplitude, due to the fact that some control input energy is consumed by the negative feedback loop. If the temperature at the output layer $LA_{OP}$ is of interest, Equation (8c) can be used to obtain the corresponding transfer function and thus the transient temperature distribution at the output layer $LA_{OP}$. With the (multi-layer) hybrid model shown previously, the dynamics of the Z-axis heat conduction and XY-plane heat diffusion are incorporated into the top layer temperature distribution according to Equation (9) and the analytical model of the transient 3D temperature field according to Equations (1a, b)-(2a, b) with local Boundary conditions BC is formulated.

Although the analytical model above was illustrated using the example of a rectangular heating plate 2, the principle can of course also be applied to more complex applications, such as three-dimensional fields with stacked plates, like in the hot foil stamping machine 1 with a heating plate 2, an installation plate 3 and one or more stamping plates 4 (see FIG. 1). Of course, the analytical model can also be applied to non-rectangular components, such as components with a cylindrical or spherical shape, like a roller. The use of the method according to the invention for estimating (and optionally controlling) a non-measurable temperature of a surface using the analytical model, in particular the described closed loop hybrid model, can of course be implemented in various other technical applications, where an interesting surface temperature cannot be directly measured. Exemplary applications are determining and/or controlling a surface temperature of a heating surface of a heating unit of a heat-sealing machine, determining and/or controlling a surface temperature of a wafer in semiconductor production or determining (e.g. monitoring) and/or controlling a surface temperature of a heat-critical surface of an electronic component of an electronic device.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. A method for controlling a temperature of a second surface of a component, in which the temperature of the second surface cannot be measured, the method comprising:
   detecting, via at least one temperature sensor, an actual temperature of a first surface of the component, spaced from the second surface opposite the second surface,
   determining an estimated value of the actual temperature of the second surface based on at least one physics-based analytical model of the heat transfer between the first surface and the second surface and the detected actual temperature of the first surface,
   wherein the physics-based analytical model comprises a hybrid model in which a distributed-parameter model is implemented in a forward path and a lumped-parameter model is implemented in a feedback path; and
   controlling the temperature of the second surface according to the determined estimated value of the actual temperature of the second surface.

2. The method according to claim 1, wherein the method further comprises correcting the estimated actual temperature of the second surface based on available temperature measurements, wherein the available temperature measurements at least include the measured actual temperature of the first surface of the component.

3. The method according to claim 1, wherein the distributed-parameter model is an eigen-function expansion model and the lumped-parameter model is a thermal impedance circuit model.

4. The method according to claim 3, wherein the method further comprises in the hybrid model dividing the component into multiple layers along a principal axis between the first surface and the second surface, determining a temperature distribution in each of the multiple layers from the distributed-parameter model and determining a heat flux between the multiple layers in the direction of the principal axis from the lumped-parameter model.

5. The method according to claim 3, wherein the forward path of the distributed-parameter model and the feedback path of the lumped-parameter model of the hybrid model form a closed-loop model.

6. The method according to claim 1, the controlling the temperature of the second surface according to the determined estimated value of the actual temperature of the second surface comprises: controlling the temperature of the second surface of the component to a predefined desired temperature with a heating device coupled to the component by:
   determining with a feedback controller a manipulated variable for the heating device based on the estimated value of the actual temperature of the second surface and the predefined desired temperature of the second surface; and
   heating the first surface of the component with the heating device using the determined manipulated variable.

7. The method according to claim 6, wherein the method further comprises: determining with a feedforward controller a feedforward control value from the predefined desired temperature of the second surface based on the at least one physics-based analytical model.

8. The method according to claim 6, wherein the component comprises a stamping interface surface of a stamping plate of a hot foil stamping machine.

9. The method according to claim 6, wherein the component comprises one of a heating surface of a heating unit of a heat sealing machine, a surface of a wafer in semiconductor production or a heat-critical surface of an electronic component of an electronic device.

10. The method according to claim 1, wherein the distributed-parameter model is implemented in the forward path to determine XY-plane heat diffusion in the component and the lumped-parameter model is implemented in the feedback path to determine Z-direction heat conduction in the component.

* * * * *